(12) United States Patent
Watanabe et al.

(10) Patent No.: US 9,758,890 B2
(45) Date of Patent: Sep. 12, 2017

(54) PRODUCTION METHOD AND DEVICE OF SURFACE ROUGHENED COPPER PLATE, AND SURFACE ROUGHENED COPPER PLATE

(71) Applicant: Furukawa Electric Co., Ltd., Tokyo (JP)

(72) Inventors: Hajime Watanabe, Shiga (JP); Sadao Ishihama, Tokyo (JP); Kiyoteru Yamamoto, Tokyo (JP); Takahiro Imai, Shiga (JP); Toshihiro Oyoshi, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 315 days.

(21) Appl. No.: 14/337,264

(22) Filed: Jul. 22, 2014

(65) Prior Publication Data
US 2014/0339094 A1 Nov. 20, 2014

Related U.S. Application Data

(62) Division of application No. 12/529,560, filed as application No. PCT/JP2008/053786 on Mar. 3, 2008, now Pat. No. 8,815,072.

(30) Foreign Application Priority Data

Mar. 2, 2007 (JP) ................................. 2007-052568

(51) Int. Cl.
*C25D 5/02* (2006.01)
*C25D 5/10* (2006.01)
(Continued)

(52) U.S. Cl.
CPC ................. *C25D 5/02* (2013.01); *C25D 5/10* (2013.01); *C25D 5/18* (2013.01); *C25D 5/34* (2013.01);
(Continued)

(58) Field of Classification Search
None
See application file for complete search history.

(56) References Cited

U.S. PATENT DOCUMENTS

| 3,772,165 A | 11/1973 | Yamagishi et al. |
| 4,443,304 A | 4/1984 | Eidschun |

(Continued)

FOREIGN PATENT DOCUMENTS

| JP | 63-033600 A | 2/1988 |
| JP | 03-082800 A | 4/1991 |

(Continued)

OTHER PUBLICATIONS

English machine translation of JP 11-298103 dated Apr. 10, 2017.*

(Continued)

*Primary Examiner* — Adam Krupicka
(74) *Attorney, Agent, or Firm* — Kubotera & Associates, LLC

(57) ABSTRACT

PROBLEMS TO BE SOLVED: To provide a process for roughening both sides of a copper plate by forming a protrusion with a fine bump shape on the both sides of the copper plate, and then to provide a process for a deterioration of an electroplating solution for plating copper to become hard to progress therein.
MEANS FOR SOLVING THE PROBLEMS: First of all, there is designed to be arranged electrodes (3, 3) as a similar pole for therebetween to be opposed to each other in an electroplating copper solution 2, and then to be arranged a copper plate 4 at therebetween. And then at first there becomes to be performed an anodic treatment for generating a copper fine particles on both surfaces of the copper plate 4, by performing an electrolytic process with the copper plate 4 as a positive electrode and the electrodes 3 as negative electrodes. And then thereafter there becomes to be performed a cathodic treatment, by performing an electro- (Continued)

plating of copper with the copper plate 4 as a negative electrode and the electrodes 3 as positive electrodes, for the copper fine particles to be fixed onto the surfaces of the copper plate 4. Furthermore, there becomes to be formed the above mentioned protrusion with the fine bump shape thereon, by performing the anodic treatment and then the cathodic treatment as not less than one cycle thereof.

2 Claims, 11 Drawing Sheets

(51) Int. Cl.
  C25D 5/34      (2006.01)
  C25F 3/02      (2006.01)
  H05K 3/38      (2006.01)
  C25D 5/18      (2006.01)
  C25D 5/48      (2006.01)
  C25D 17/00     (2006.01)
  C25D 7/00      (2006.01)
  H05K 3/00      (2006.01)
  C25D 3/38      (2006.01)
  H05K 1/05      (2006.01)

(52) U.S. Cl.
  CPC .............. *C25D 5/48* (2013.01); *C25D 7/00* (2013.01); *C25D 17/00* (2013.01); *C25F 3/02* (2013.01); *H05K 3/0085* (2013.01); *H05K 3/384* (2013.01); *C25D 3/38* (2013.01); *H05K 1/056* (2013.01); *H05K 2201/0355* (2013.01); *H05K 2203/0307* (2013.01); *H05K 2203/0723* (2013.01); *H05K 2203/1572* (2013.01); *Y10S 205/92* (2013.01); *Y10T 428/12361* (2015.01)

(56) References Cited

U.S. PATENT DOCUMENTS

| | | |
|---|---|---|
| 4,552,627 A | 11/1985 | Parthasarathi |
| 4,681,665 A | 7/1987 | Guillermet et al. |
| 5,792,333 A | 8/1998 | Oguro et al. |
| 2004/0191560 A1* | 9/2004 | Matsuda .................. C25D 5/16 428/626 |
| 2011/0139627 A1 | 6/2011 | Keigler et al. |

FOREIGN PATENT DOCUMENTS

| | | |
|---|---|---|
| JP | 11-298103 A | 10/1999 |
| JP | 2005-008973 A | 1/2005 |
| TW | 379260 B | 1/2000 |

OTHER PUBLICATIONS

Notification of the First Office Action, Application No. 2011104418361, Dec. 5, 2013, State Intellectual Property Office of the People's Republic of China.

Extended European Search Report for EP Patent Application 08721206.4, European Patent Office, Mar. 30, 2011.

F.A Lowenheim, Electroplating, McGraw-Hill Book Company, New York, 1978, pp. 12-13.

\* cited by examiner

PRIOR ART

Scanning electron micrograph showing surface state of
copper foil of common printed circuit board

PRIOR ART

PRODUCTION METHOD AND DEVICE OF SURFACE ROUGHENED COPPER PLATE, AND SURFACE ROUGHENED COPPER PLATE

CROSS-REFERENCE TO RELATED APPLICATIONS

This is a divisional application of a prior application Ser. No. 12/529,560, filed Apr. 23, 2010, allowed.

TECHNICAL FIELD

The present invention relates to a method of producing a copper plate with a roughened surface used for a metal core of a metal core circuit board, a device for producing the copper plate with the roughened surface, and the copper plate with the roughened surface.

BACKGROUND ART

A metal core circuit board includes a metal plate with good thermal conductivity embedded in an insulating substrate, thereby improving heat uniformity and heat dissipation. The embedded metal plate improves a thermal characteristic of the circuit board. Hence, it is possible to flow a larger amount of an electric current even in a similar circuit pattern, thereby reducing a size of a circuit, a peripheral component, or the like.

FIG. 15 is a cross sectional view showing an example of the metal core circuit board. In the figure, 11 designates an insulating substrate (a prepreg hardened through pressing and heating); 12 designates a metal plate embedded in the insulating substrate 11; 13 designates a circuit pattern formed on a surface of the insulating substrate 11; 14 designates a through hole plating; and 15 designates a solder resist.

The metal plate as a core of the metal core circuit board is formed of a copper plate, a copper alloy plate, an aluminum plate, an aluminum alloy plate, or the like, preferably a copper plate in view of thermal conductivity. When the core is formed of the copper plate, the core selectively has a thickness approximately between 100 μm and 500 μm, so that the metal core circuit board has sufficient heat uniformity and heat dissipation.

Soldering is performed onto the metal core circuit board with a reflow furnace or the like in a component mounting process. During the process, it is necessary to prevent an interface between the core metal plate 12 and the insulating substrate 11 from being delaminated due to heating. Further, it is necessary to provide the core metal plate and the insulating substrate with sufficient adhesion and heat resistance against heat generated in use.

In general, a copper foil used as a circuit conductive member of a circuit board is an electrolytic copper foil having a roughened surface on one side and a gloss surface on the other side. Normally, the roughened surface is formed through electroplating, and copper plating or the like is performed on the roughened surface to grow a protrusion with a fine bump shape, thereby producing the electrolytic copper foil. FIG. 16 shows a scanning electron micrograph of the roughened surface of the electrolytic copper foil for the circuit board. The copper foil formed through electroplating has a thickness between 35 μm and 70 μm. When the copper foil has a thickness greater than the range, it takes a long period of time for plating, thereby increasing cost for a practical use. Further, the core of the metal core circuit board needs to have the roughened surface on both sides. In order to use the electrolytic copper foil as the core metal plate, it is necessary to perform an additional roughening treatment on the gloss surface thereof, thereby further increasing cost.

In many cases, a large number of holes are formed in the core metal plate of the metal core circuit board for forming through holes connecting circuit patterns on both surfaces. After performing the roughening treatment on the both surfaces of the copper plate without holes, when holes are formed in the copper plate, the roughened surfaces may be damaged. Further, it is necessary to clean and remove machine oil attached to the copper plate when holes are formed. Accordingly, it is desirable to perform the roughening treatment on the both surfaces after forming the holes for the through holes in the copper plate.

In view of the reasons mentioned above, it is difficult to use the electrolytic copper foil for the core metal plate of the metal core circuit board.

When a rolled copper plate capable of being produced with a rolling mill roll at a relatively low price is used for a copper plate with a thickness greater than 100 μm, i.e., a preferred thickness for the core of the metal core circuit board, it is possible to significantly reduce cost. However, the rolled copper plate has smooth surfaces on both sides. Accordingly, when the rolled copper plate is embedded in an insulating substrate, it is necessary to perform the roughening treatment on both surfaces thereof for enhancing adhesion to the insulating substrate (a glass epoxy board).

A process for roughening the surface of the copper plate includes etching, a chemical treatment, or the like. A typical example is CZ treatment of MEC COMPANY LTD. In the CZ treatment, a copper etching particle and a organic nitrogen compound coating film are formed on the surface of the copper plate using a oxidation reduction reaction of a bivalent copper compound, so that it is possible to obtain a peeling strength between 0.4 kN/m and 0.8 kN/m according to JIS-C6471. When the peeling strength in the range is obtained, it is possible to satisfy a minimum requirement for the roughening process for adhering to the insulating substrate.

There has been known a process for forming a protrusion with a fine bump shape on a surface of a copper plate through a copper plating process at a high current density such as a copper foil of a printed circuit board or the like (refer to patent document 1). The protrusion with the fine bump shape has an anchoring effect. Accordingly, it is effective for enhancing adhesion to the insulating substrate as opposed to etching, chemical treatment, or the like.

Patent Document 1: Japanese Patent Publication No. 2005-008973

DISCLOSURE OF THE INVENTION

Problems to be Solved by the Invention

When a surface of a rolled copper plate is roughened, as compared to an electrolytic copper foil, it is possible to obtain only a shallow roughened surface through etching, chemical treatment, or the like. Further, as compared to an electrolytic copper foil, the peeling strength is low, and it is difficult to obtain reliability in heat resistance similar to that of the electrolytic copper foil. Further, in etching, a large quantity of a waste solution is generated corresponding to a number of processes, thereby causing cost and environmental issue.

In the process disclosed in patent document 1, the surface of the foil of copper is roughened through copper plating at a high current density. Accordingly, a copper plating solution tends to be easily deteriorated, and a large amount of the copper plating solution is consumed, thereby increasing cost.

Further, the electrolytic copper foil is produced through plating in a state that one surface thereof contacts with a drum electrode while rotating. Hence, only one surface of the copper foil is roughened, and it is necessary to roughen a gloss surface thereof through copper plating. Accordingly, it is difficult to apply the roughening process through copper plating on both surfaces of the copper plate.

An object of the present invention is to provide a method of producing a copper plate with a roughened surface, and to provide a device for producing the copper plate with a roughened surface, in which it is possible to concurrently roughen both surfaces of a copper plate regardless of holes for through holes without excessively deteriorating an electroplating copper solution.

Means for Solving the Problem

According to the present invention, a method of producing a copper plate with a roughened surface through forming a protrusion in a fine bump shape on a surface of the copper plate to roughen the surface of the copper plate, includes the steps of:

arranging electrodes with a same polarity to face each other in an electroplating copper solution;

arranging the copper plate between the electrodes; and performing more than one cycle of an anodic treatment and a cathodic treatment to form the protrusion in the fine bump shape. The anodic treatment is performed for forming a copper fine particle on both surfaces of the copper plate through an electrolytic process with the copper plate as a positive electrode and the electrodes as a negative electrode. The cathodic treatment is performed after the anodic treatment for fixing the copper fine particle to the surfaces of the copper plate through a copper electroplating with the copper plate as a negative electrode and the electrodes as a positive electrode.

According to the present invention, in order to adjust a plate thickness, the method may further includes the step of performing a copper plating with the copper plate as the negative electrode and the electrodes as the positive electrode in an electroplating copper solution before performing the anodic treatment for the first time.

According to the present invention, in the method of producing the copper plate with the roughened surface, one pair of the electrodes with the same polarity may be arranged in the electroplating copper solution to face each other, the copper plate may be arranged between the electrodes with the same polarity, and more than one cycle of the anodic treatment and the cathodic treatment may be performed without moving the copper plate relative to the electrodes with the same polarity.

According to the present invention, in the method of producing the copper plate with the roughened surface, one pair of positive electrodes may be arranged to face each other in the electroplating copper solution, one pair of negative electrodes may be arranged to face each other in the electroplating copper solution in parallel to the positive electrodes, and more than one cycle of the anodic treatment and the cathodic treatment may be performed. The anodic treatment is performed with the copper plate as the positive electrode while the copper plate is arranged between the negative electrodes. The cathodic treatment is performed with the copper plate as the negative electrode after the copper plate relatively moves between the positive electrodes.

According to the present invention, in the method producing the copper plate with the roughened surface, one pair of or a plurality of pairs of positive electrodes may be arranged to face each other in the electroplating copper solution, one pair of or a plurality of pairs of negative electrodes may be arranged to face each other in the electroplating copper solution in parallel to the positive electrodes, and the anodic treatment and the cathodic treatment may be performed alternately while the copper plate is sequentially moving from between the electrodes at one end side to between the electrodes at the other end side.

According to the present invention, in the method of producing the copper plate with the roughened surface, the anodic treatment and the cathodic treatment may be performed on a combined copper plate formed of two copper plates in one sheet. The combined copper plate is separated into the copper plates one by one to obtain two copper plates with one roughened surface.

According to the present invention, in the method of producing the copper plate with the roughened surface, the anodic treatment is preferably performed with an electric current density between 1 A/dm$^2$ and 8 A/dm$^2$ for three minutes to ten minutes, and the cathodic treatment is preferably performed with an electric current density between 1 A/dm$^2$ and 8 A/dm$^2$ for three minutes to ten minutes.

According to the present invention, in the method of producing the copper plate with the roughened surface, the electroplating copper solution is preferably maintained at a temperature between 18° C. and 32° C., more preferably between 24° C. and 30° C.

Further, the method of producing the copper plate with the roughened surface preferably further includes the step of forming a predetermined hole in the copper plate at a predetermined position thereof before performing the anodic treatment and the cathodic treatment.

According to the present invention, a device for producing a copper plate with a roughened surface preferably includes an electrolytic bath for retaining an electroplating copper solution; one pair or a plurality of pairs of positive electrodes arranged in the electrolytic bath to face each other in a tandem arrangement; one pair or a plurality of pairs of negative electrodes arranged in the electrolytic bath to face each other in a tandem arrangement; a negative electrode bus bar arranged horizontally at an upper side between the one pair or the plurality of pairs of the positive electrodes for hanging the copper plate; a positive electrode bus bar arranged horizontally at an upper side between the one pair or the plurality of pairs of the negative electrodes for hanging the copper plate; and an insulating bar for connecting the negative electrode bus bar and the positive electrode bus bar.

According to the present invention, a device for producing a copper plate with a roughened surface preferably includes an electrolytic bath for retaining an electroplating copper solution; one pair or a plurality of pairs of positive electrodes and one pair or a plurality of pairs of negative electrodes alternately arranged in the electrolytic bath to face each other in a tandem arrangement; a negative electrode bus bar arranged horizontally at an upper side between the one pair or the plurality of pairs of the positive electrodes for hanging the copper plate; a positive electrode bus bar arranged horizontally at an upper side between the one pair or the plurality of pairs of the negative electrodes for hanging the copper plate; and an insulating bar for connecting the negative electrode bus bar and the positive electrode bus bar.

According to the present invention, a copper plate with a roughened surface has a predetermined hole formed at a predetermined position thereof. A surface of the copper plate includes a protrusion with a fine bump shape having a grain size not larger than 10 μm, and a surface roughness Rz between 3 μm and 20 μm. In this case, the hole preferably includes a roughened inner face, and the protrusion with the fine bump shape on the inner face of the hole preferably has a height not higher than 20 μm.

Effects of the Invention

According to the present invention, the anodic treatment is performed for generating copper fine particles on both surfaces of the copper plate through the electrolytic process with the copper plate as the positive electrode and the electrodes as the negative electrode. Afterward, the cathodic treatment is performed for fixing the fine copper particles to the surfaces of the copper plate through the copper plating with the copper plate as the negative electrode and the electrodes as the positive electrode. Accordingly, it is possible to form the protrusion with the fine bump shape on both surfaces of the copper plate, thereby roughening both surfaces of the copper plate. The anodic treatment and the cathodic treatment are performed in the same electroplating copper solution. Accordingly, the copper plate supplies copper ions during the anodic treatment, and the copper ions in the solution are consumed during the cathodic treatment. When values of electric currents are set close to each other during the anodic treatment and the cathodic treatment, a variation in a concentration of the copper ions in the processing solvent becomes very small. Hence, the electroplating copper solution tends not to be deteriorated easily, thereby making it possible to use the electroplating copper solution over a long period of time. As a result, it is possible to reduce a consumed quantity of the electroplating copper solution, thereby reducing cost. It is desirable that the values of the electric currents during the anodic treatment and the cathodic treatment are the same. Even when there is a difference, it is possible to suppress consumption of the copper ions as opposed to ordinary copper plating. Further, it is possible to roughen both surfaces of the copper plate and the inner faces of the holes for the through holes at the same time. Accordingly, it is possible to easily obtain the copper plate with the roughened surface suitable for a metal core of a metal core circuit board.

Before performing the anodic treatment for the first time, when the copper plating is performed with the copper plate as the negative electrode and the electrodes as the positive electrode, it is possible to easily form the protrusion with the fine bump shape, and to adjust the thickness of the copper plate as well.

After the anodic treatment and the cathodic treatment are performed on the combined copper plate formed of the two copper sheets combined in the one sheet, when the combined copper plate is separated into the copper plates one by one, it is possible to obtain the two copper plates with one roughened surface. In the copper plate thus obtained, an opposite surface of the roughened surface is not roughened to a large extent and remains smooth.

According to the present invention, in addition to the plating process of the present invention, the device of producing the plate is applicable to other types of plating processes such as a horizontal line, a vertical line, a pusher line, or the like, as far as the process satisfies a basic principle of the plating process of the present invention.

BEST MODE FOR CARRYING OUT THE INVENTION

First Embodiment

FIG. 1 shows one embodiment according to the present invention. In the figure, 1 designates an electrolytic bath, 2 designates an electroplating solution for plating copper retained in the electrolytic bath 1, 3 designates a pair of electrodes with a same polarity arranged in the electroplating copper solution 2 to face each other, 4 designates a copper plate with a surface thereof to be roughened arranged at between the electrodes 3, 5 designates a frame body for holding the copper plate 4, 6 designates a hanger metal fitting, and 7 designates a bus bar for maintaining the copper plate 4 as a positive electrode or a negative electrode via the hanger metal fitting 6 and the frame body 5. An electrical wiring for maintaining the electrodes 3 at a polarity opposite to that of the copper plate 4 is not shown in the figure The electrodes 3 are formed of a copper plate or a copper bar. It is possible to use an insoluble electrode available in market as well (an oxide based insoluble electrode with titanium as a base material, a platinum based insoluble electrode or the like). The electrode normally has a facing area similar to one surface of the copper plate to be roughened. It may be possible to increase or decrease the area, or to divide the electrode into a plurality of sheets according to circumstances. The electroplating copper solution 2 is an electroplating solution for plating copper available in market. The electroplating copper solution 2 has a composition of, for example: copper sulfate between 40 g/l and 250 g/l; sulfuric acid between 30 g/l and 210 g/l; hydrochloric acid between 10 ppm and 80 ppm; and an additive agent such as a brightening agent or the like in a quantity specified by a maker (as approximately between 2 ml/l and 10 ml/l). The electroplating copper solution 2 is agitated by a pneumatic agitating unit (bubbling) arranged at a bottom part of the electrolytic bath 1, a jet nozzle arranged between the electrode in the bath 1 and the copper plate with the surface to be roughened, or the like (not shown).

In the device with the configuration mentioned above, first, an anodic treatment is performed for generating copper fine particles on both surfaces of the copper plate 4 in a quantity required for forming a protrusion with a fine bump shape thereon through an electrolytic process with the copper plate 4 as a positive electrode and the electrodes 3 as negative electrodes. Next, the polarity is reversed, and a cathodic treatment is performed for fixing the copper fine particles to the surfaces of the copper plate 4 through an electroplating with the copper plate 4 as a negative electrode and the electrodes 3 as positive electrodes. Through the anodic treatment and the cathodic treatment, it is possible to form the protrusion with the fine bump shape onto the surfaces of the copper plate, that is superior in adhesive property to an insulating substrate, similar to the protrusion with the fine bump shape on the surfaces of the conventional electrolytic copper foil. After the cathodic treatment, the copper plate with the roughened surface is moved outside the electrolytic bath 1, and a washing process is performed in clear water. As required, an after treatment such as an acid cleaning process, a washing water process, a rust prevention process or the like is performed. The after treatment is similar to an after treatment performed in the normal copper electroplating process.

The copper fine particles generated in the anodic treatment are so called an anode slime, i.e., an unnecessary substance in the copper electroplating, and are considered to be generated when copper, copper oxide, copper ions, or the like at a high concentration remains on the surface of the copper plate due to a difference between a precipitation rate of the copper ions from the copper plate and a diffusion rate of the ions into the plating solution in the anodic treatment. In the present invention, the anode slime is utilized for forming the protrusion with the fine bump shape. When the copper fine particles are generated in a large amount, the copper fine particles tend to move away from the surface of the copper plate, thereby making it difficult to form the protrusion with the fine bump shape thereon. When the copper fine particles are generated in a small amount, it is difficult to form the protrusion with the fine bump shape. A condition of the anodic treatment may vary for forming the copper fine particles in a necessary quantity to form the protrusion with the fine bump shape on the surface of the copper plate according to a density of an electric current, a processing time, a solution temperature, or the like, and it is determined experimentally. According to the experiment, preferred conditions of the anodic treatment are the electric current density between 1 A/dm$^2$ and 8 A/dm$^2$, the solution temperature between 18° C. and 32° C., and the processing time between three minutes and ten minutes. A condition of the cathodic treatment for fixing the copper fine particles to the surfaces of the copper plate is determined experimentally as well. According to the experiment, preferred conditions of the cathodic treatment are the electric current density between 1 A/dm$^2$ and 8 A/dm$^2$, the solution temperature between 18° C. and 32° C., and the processing time between three minutes and ten minutes. The conditions are approximately similar to conditions of the ordinary copper electroplating.

An important point of the present invention is that the protrusion with the fine bump shape is formed not by performing the copper electroplating at a higher electric current density such as the process for roughening the surface of the electrolytic copper foil, but by performing the process for generating the copper fine particles and then by performing the process for fixing the same thereon under the conditions of the ordinary copper electroplating. According to the processes, the similar individual processes of the anodic treatment and the cathodic treatment are performed in the electroplating copper solution. Accordingly, it is possible to reduce a consumption of the copper ions. Hence, the electroplating copper solution is less deteriorated, and it is possible to use the plating solution for a long period of time. As a result, it becomes able to reduce the quantity of the plating solution to be consumed.

It is possible to roughen the surface of the copper plate by performing the individual processes of the anodic treatment and then the cathodic treatment in only one cycle. When it is required to obtain high heat resistance, it is desirable to perform the processes more than two cycles. The copper electroplating may be performed in the same device before the anodic treatment for the first time. The copper electroplating is effective for forming the protrusion with the fine bump shape, or adjusting a thickness of the copper plate.

Similar to the method described above, after the anodic treatment and the cathodic treatment are performed on a copper plate combined of two copper plates, the combined copper plate may be separated into the copper plates one by one. Accordingly, it is possible to obtain the two copper plates with roughened one surface (similar for the embodiments described below). When the copper plates are obtained in such a manner, a backside surface of the roughened surface is not roughened. Accordingly, it is possible to maintain the backside surface smooth.

Second Embodiment

FIG. 2 shows another embodiment according to the present invention. In FIG. 2, a similar symbol is used for a part similar to that in FIG. 1. In the embodiment, different from the first embodiment, the electrolytic bath 1 is extended, and one pair of positive electrodes 3a facing each other and one pair of negative electrodes 3c facing each other are arranged in a tandem arrangement in the electroplating copper solution 2. A negative electrode bus bar 7c is arranged horizontally at an upper side between the pair of the positive electrodes 3a. A positive electrode bus bar 7a is arranged horizontally at an upper side between the one pair of the negative electrodes 3c. The negative electrode bus bar 7c and the positive electrode bus bar 7a are connected in a linear form via an insulating bar 8. The negative electrodes 3c are made of a copper plate or a copper bar. The positive electrodes 3a are formed of a copper plate or a copper bar, and are preferably formed of an insoluble electrode (an oxide based insoluble electrode with titanium as a base material, a platinum based insoluble electrode, or the like). The electrode normally has a facing area similar to one surface of the copper plate to be roughened. It may be possible to increase or decrease the area, or to divide the electrode into a plurality of sheets according to circumstances.

When the copper plate with the roughened surface is produced with the device, the copper plate 4 is hung on the positive electrode bus bar 7a and arranged between the negative electrodes 3c as shown in FIGS. 2(A) and (B), and the anodic treatment is performed with the copper plate 4 as the positive electrode. Accordingly, the copper fine particles are formed with a sufficient quantity for forming the protrusion with the fine bump shape on both of the surfaces of the copper plate 4. After the anodic treatment, the hanger metal fitting 6 is moved from the positive electrode bus bar 7a over the insulating bar 8 to the negative electrode bus bar 7c, so that the copper plate 4 is arranged between the positive electrodes 3a. In this state, the cathodic treatment is performed with the copper plate 4 as the negative electrode. During the cathodic treatment (copper plating), the copper fine particles are fixed onto the copper plate, and the protrusion with the fine bump shape are formed onto the surfaces of the copper plate. After the cathodic treatment, the copper plate with the roughened surface is moved outside the electrolytic bath 1, and a washing process is performed in clear water. As required, an after treatment such as an acid cleaning process, a washing water process, a rust prevention process or the like is performed. The after treatment is similar to an after treatment performed in the normal copper electroplating process.

The anodic treatment and the cathodic treatment may be performed in only one cycle, and it is desirable to perform the processes more than two cycles. When the processes are performed than the two cycles, after the cathodic treatment in the previous cycle, the copper plate is moved back between the negative electrodes 3c and the anodic treatment is performed. When the processes are performed than the two cycles, the cathodic treatment is performed in the end. Before the anodic treatment at the first time, the copper plate may be arranged between the negative electrodes to perform the copper electroplating.

When the anodic treatment and the cathodic treatment are performed in one cycle, it possible to perform the anodic treatment and the cathodic treatment at the same time by arranging a next copper plate to be roughened between the negative electrodes 3c when the copper plate is moved between the positive electrodes 3a as shown in FIGS. 2(C) and (D) to perform the cathodic treatment after the anodic treatment. Accordingly, it is possible to increase production efficiency of the copper plate with the roughened surface two times as opposed to the first embodiment.

Third Embodiment

FIG. 3 shows a further embodiment according to the present invention. In FIG. 3, a similar symbol is used for a part similar to that in FIG. 2. In the embodiment, the electrolytic bath 1 is extended approximately two times that of the device shown in FIG. 2 for performing the anodic treatment and the cathodic treatment of the copper plate two cycles. Further, one pair of positive electrodes 3a facing each other and one pair of negative electrodes 3c facing each other are arranged alternately in a tandem arrangement in the electroplating copper solution 2. Further, the negative electrode bus bar 7c is arranged horizontally at the upper side between the one pair of the positive electrodes 3a, and the positive electrode bus bar 7a is arranged horizontally at the upper side between the one pair of the negative electrodes 3c. The negative electrode bus bar 7c and the positive electrode bus bar 7a adjacent to each other are connected in a linear form via the insulating bar 8.

For producing the copper plate with the roughened surface with the device, the copper plate 4 is moved from between the negative electrodes 3c at one end of the electrolytic bath 1 (at left side in the figure) to between the positive electrodes 3a at the other end thereof, and the anodic treatment and the cathodic treatment are alternately performed. After the cathodic treatment between the positive electrodes 3a at the other end, the copper plate with the roughened surface is moved outside the electrolytic bath 1, and a washing process is performed in clear water. As required, an after treatment such as an acid cleaning process, a washing water process, a rust prevention process or the like is performed. The after treatment is similar to an after treatment performed in the normal copper electroplating process. After moving out the copper plate 4 from between the positive electrodes 3a at the other end to outside the electrolytic bath 1, remaining three copper plates are moved to the other end by one pitch. Then, a copper plate to be roughened next is placed between the negative electrodes 3c at the one end opened, and the anodic treatment and the cathodic treatment are performed between all of the electrodes at the same time. Accordingly, it is possible to continuously perform the anodic treatments and the cathodic treatments in two cycles.

The negative electrodes 3c are made of a copper plate or a copper bar. The positive electrodes 3a may be formed of a copper plate or a copper bar, and are preferably formed of an insoluble electrode (an oxide based insoluble electrode with titanium as a base material, a platinum based insoluble electrode, or the like). The electrode normally has a facing area similar to one surface of the copper plate to be roughened. It may be possible to increase or decrease the area, or to divide the electrode into a plurality of sheets according to circumstances.

When a larger number or a larger quantity of copper plates are processed, a cathodic treatment section and an anodic treatment are arranged to have lengths and numbers several times more than the case in addition to the electrodes facing each other. The copper plates in a number corresponding to the multiple number are concurrently processed at an increased travelling speed thereof, thereby arbitrarily increasing a processing tact. In this case, a length ratio of the processing bath may be adjusted according to a required number of the cathodic treatment and the anodic treatment, a time ratio, or the like. With the device, it is possible to produce the copper plate with the roughened surface with the tact less than the required time of the cathodic treatment and the anodic treatment.

The anodic treatment and the cathodic treatment may be performed more than three cycles as required. When performing more than three cycles, more than three sets of one pair of positive electrodes 3a facing each other and one pair of negative electrodes 3c facing each other may be arranged alternately in a tandem arrangement.

(Conditions of the Anodic Treatment)

Conditions of the anodic treatment are determined through an experiment. According to the experiment, for generating the copper fine particles in a quantity sufficient for forming the protrusion with the fine bump shape on both surfaces of the copper plate, the process is preferably performed in an ordinary copper electroplating solution (copper sulfate between 40 g/l and 250 g/l, sulfuric acid between 30 g/l and 210 g/l, hydrochloric acid between 10 ppm and 80 ppm, an additive such as a brightening agent or the like in a quantity specified by a maker) with the electric current density between 1 A/dm$^2$ and 8 A/dm$^2$ for between three minutes and ten minutes, while maintaining the plating solution at a temperature between 18° C. and 32° C.

Even when the solution temperature and the electric current density are within the ranges, if the processing time for the anodic treatment is shorter than three minutes, it is difficult to form the protrusion with the fine bump shape due to an insufficient quantity of the copper fine particles formed on the surface of the copper plate. When the processing time for the anodic treatment is longer than ten minutes, it is difficult to form the protrusion with the fine bump shape in a preferred way due to an excessive quantity of the copper fine particles formed on the surface of the copper plate. Hence, it is desirable that the processing time for the anodic treatment is between four minutes and eight minutes, more preferably between four minutes and six minutes.

Even when the solution temperature and the processing time are within the ranges, if the electric current density is lower than 1 A/dm$^2$, it is difficult to form the protrusion with the fine bump shape due to an insufficient quantity of the copper fine particles formed on the surface of the copper plate. If the electric current density is higher than 8 A/dm$^2$, it is difficult to form the protrusion with the fine bump shape in a preferred way due to an edge delamination or an excessive quantity of the copper fine particles formed on the surface of the copper plate. Hence, it is desirable that the electric current density of the anodic treatment is between 1 A/dm$^2$ and 8 A/dm$^2$, more preferably between 1 A/dm$^2$ and 5 A/dm$^2$.

Even when the electric current density and the processing time are within the ranges, if the solution temperature is lower than 18° C., it is difficult to form the protrusion with the fine bump shape due to an insufficient quantity of the copper fine particles formed on the surface of the copper plate. When the solution temperature is higher than 32° C., it is difficult to form the protrusion with the fine bump shape in a preferred way due to an excessive quantity of the copper fine particles formed on the surface of the copper plate.

(Conditions of the Cathodic Treatment)

Conditions of the cathodic treatment are determined through an experiment as well. The cathodic treatment is performed in the copper plating solution similar to the anodic treatment. Accordingly, a solution temperature is similar to that of the anodic treatment. Moreover, the anodic treatment and the cathodic treatment are performed at the same time. Accordingly, a processing time is desirable to be similar to that of the anodic treatment. An electric current density of the anodic treatment is different from that of the cathodic treatment. The cathodic treatment is preferably performed with the electric current density between 1 $A/dm^2$ and 8 $A/dm^2$. When the electric current density is lower than 1 $A/dm^2$, it is difficult to fix the protrusion with the fine bump shape on the surface of the copper plate due to an insufficient copper plating amount. When the electric current density is higher than 8 $A/dm^2$, the protrusion with the fine bump shape tends to be covered with a plated layer due to an excessive copper plating amount, so that it is difficult to form the protrusion with the fine bump shape thereon in a preferred way. Hence, it is desirable that the electric current density of the cathodic treatment is between 1 $A/dm^2$ and 8 $A/dm^2$, more preferably between 1 $A/dm^2$ and 5 $A/dm^2$.

(Regarding the Protrusion with the Fine Bump Shape)

The protrusion with the bump shape is a precipitated form, in which a copper plate base and a particle or particles are attached through a necking (constricted part). With the necking, an anchoring effect is created with respect to a resin of an insulating substrate, thereby increasing an adhesive strength. The form includes a bump with a cluster shape (a bunch shape of grapes) in a size between approximately 1 µm and 20 µm, in which particles are connected each other. Further, the protrusion with the bump shape also includes a mixture of a protrusion without a necking and a protrusion with a bump shape, as long as it satisfies a particle size and a grain size described later. It is desirable that the grain size of the protrusion with the bump shape is not larger than 10 µm. In the range, the adherence between the protrusion and the base of the copper plate is good, thereby obtaining a good strength with the insulating substrate. The grain size of the protrusion with the fine bump shape is more preferably between 0.5 µm and 3 µm, so that uniformity and the bonding strength between the protrusion and the base are further improved. A roughness Rz is measured macroscopically. The roughness Rz is preferably between 3 µm and 20 µm. In the range, the adherence between the protrusion and the base and the bonding strength with the insulating substrate are good. The roughness Rz thereon is more preferably between 7 µm and 16 µm, so that uniformity and the bonding strength between the protrusion and the base are further improved. Note that it is hard to measure a roughness of an inner face of a hole. It may be suffice that the inner face of the hole is roughened, as far as the bumps are not overgrown to decrease a diameter of the hole less than specification, or the bumps are not peeled off upon laminating the insulating substrate. A height of the bump (in a case of a cluster shape, an entire height of the cluster is considered to be the height of the bump) is preferably less than 20 µm. In the range, the diameter of the hole does not decrease, or the bump is not peeled off.

In the processes described above, an arbitrary jig may be used for holding the copper plate to be roughened. The jig is preferably made of a metal such as copper, a copper alloy, stainless, titanium, or the like. The electric current is consumed even on a metal surface of the jig itself. Accordingly, it is necessary to set a value of the electric current necessary for the processes by adding a metal surface area of the jig immersed in the solution to a surface area of the plate to be processed.

EXAMPLES

The copper plate used in examples is a tough pitch copper rolled plate having a length of 500 mm, a width of 380 mm, and a thickness of 400 µm or 200 µm. The copper plate with the thickness of 400 µm is processed for drilling holes for through holes with an inner diameter between 1 mm and 2 mm and a total area of 10% of a plate area (locations of the holes are arbitrary). The copper plate with the thickness of 200 µm is processed in an overlapped state of two sheets to obtain the copper plate with roughened one side used for a peel test.

A composition of the electroplating solution for the processes is: copper sulfate 90 g/l; sulfuric acid 180 g/l; and hydrochloric acid 60 ppm. As a supplementary agent, a brightening agent and a restraining agent used for a copper gloss plating in general are used with a quantity specified by a maker. An example of a commercial product of the brightening agent and the restraining agent includes COPPER GLEAM™ brightening agent for a copper sulfate plating produced by Rohm and Haas Company, KUPPE-LIGHT™ and PYRONIKKA™ produced by Nihon Kagaku Sangyo Co., Ltd., or the like. The agents are selected according to a type of plating bath, a substance for the electrodes, an object to use the final product, or the like.

Example 1

The anodic treatment is performed on the copper plates with the thicknesses of 400 µm and 200 µm at a solution temperature of 28° C. and an electric current density of 4.5 $A/dm^2$ for approximately five minutes. Thereafter, the cathodic treatment is performed at the same solution temperature and an electric current density of 1.4 $A/dm^2$ for approximately five minutes, thereby producing the copper plate with the roughened surface. A surface of the copper plate with the roughened surface is shown in FIG. 4 (a magnification of 3,000 in SEM). It is found that the grain size of the protrusion with the fine bump shape on the primary surface is not larger than 3 µm, and the surface is covered uniformly with the protrusion with the fine bump shape. A bump with a cluster shape is also found, and a grain size and a height thereof are not more than 10 µm. The surface roughness is measured with a super deep color 3D shape measurement microscope VK-9510 produced by KEYENCE CORPORATION, and the surface roughness Rz is 7.5 µm. There is no difference in the shape of the protrusion with the fine bump shape between the copper plate with the thickness of 400 µm and the copper plate with the thickness of 200 µm.

A commercially available adhesive tape with a width of 10 mm is attached to the copper plate with the roughened surface, and the pulling off test is performed. As a result thereof, the protrusion with the fine bump shape is not peeled off, and only an adhesive of the adhesive tape is peeled off from an interface of the adhesive tape, and the adhesive of the adhesive tape remains on the copper plate with the roughened surface.

Next, ten sheets of commercially available glass epoxy prepreg FR-4 (an insulating substrate material) with a thickness of 0.1 mm are laminated on the copper plate with one roughened side with the thickness of 200 µm. They are integrated through pressing and heating under a condition similar to that of a hot pressing of an electrolytic copper foil and the FR-4 prepreg, thereby obtaining a laminated plate of the copper plate and the insulating plate. A sample is cut out from the laminated plate, and a peeling strength test is performed according to JIS-C6471 on an actual sample and a sample after soaking into a molten solder at a temperature of 260° C. for sixty seconds. A result is shown in Table 1. The peeling strength is sufficiently satisfying a bonding strength between the metal core and the insulating substrate required for a metal core substrate for a circuit board (higher than 1 kN/m).

are not more than 10 μm. The surface roughness is measured with a super deep color 3D shape measurement microscope VK-9510 produced by KEYENCE CORPORATION, and the surface roughness Rz is 11.0 μm.

A commercially available adhesive tape with a width of 10 mm is attached to the copper plate with the roughened surface, and the pulling off test is performed. As a result thereof, the protrusion with the fine bump shape is not peeled off, and only an adhesive of the adhesive tape is peeled off from an interface of the adhesive tape, and the

TABLE 1

| | Location of the measurement | | | | | | | |
|---|---|---|---|---|---|---|---|---|
| | Upper side at center | Lower side at center | Upper side at right end | Center at right end | Lower side at right end | Upper side at left end | Center at left end | Lower side at left end |
| | Initial stage (before the solder heat resistant test) (kN/m) | | | | | | | |
| MIN | 2.2 | 2.4 | 2.3 | 2.1 | 2.2 | 2.7 | 2.3 | 2.4 |
| MAX | 2.5 | 2.4 | 2.9 | 2.7 | 2.5 | 2.9 | 2.8 | 3.0 |
| AVG | 2.4 | 2.4 | 2.5 | 2.6 | 2.3 | 2.4 | 2.5 | 2.6 |
| | After the solder heat resistant test at 260° C. for 60 seconds (kN/m) | | | | | | | |
| MIN | 2.1 | 2.2 | 2.1 | 2.0 | 2.0 | 2.5 | 2.3 | 2.2 |
| MAX | 2.4 | 2.5 | 2.5 | 2.4 | 2.2 | 2.6 | 2.5 | 2.6 |
| AVG | 2.3 | 2.4 | 2.4 | 2.3 | 2.4 | 2.5 | 2.4 | 2.4 |

Location of the measurement
Upper edge of the copper plate to be roughened

| Upper side at left end | Upper side at center | Upper side at right end |
| Center at left end | Lower side at center | Center at right end |
| Lower side at left end | | Lower side at right end |

Lower edge of the copper plate to be roughened

Example 2

The anodic treatment is performed on the copper plates with the thicknesses of 400 μm and 200 μm at a solution temperature of 24° C. and an electric current density of 4.5 A/dm² for five minutes. Thereafter, the cathodic treatment is performed at the same solution temperature and an electric current density of 2 A/dm² for approximately five minutes. The processes are defined as one cycle, and the processes are performed two cycles, thereby producing the copper plate with the roughened surface. A surface of the copper plate with the roughened surface is shown in FIG. 5 (a magnification of 3,000 in SEM). It is found that the grain size of the protrusion with the fine bump shape on the primary surface is not larger than 3 μm, and the surface is covered uniformly with the protrusion with the fine bump shape. A bump with a cluster shape is found, and a grain size and a height thereof adhesive of the adhesive tape remains on the copper plate with the roughened surface.

Next, ten sheets of commercially available glass epoxy prepreg FR-4 (an insulating substrate material) with a thickness of 0.1 mm are laminated on the copper plate with one roughened side with the thickness of 200 μm. They are integrated through pressing and heating under a condition similar to that of a hot pressing of an electrolytic copper foil and the FR-4 prepreg, thereby obtaining a laminated plate of the copper plate and the insulating plate. A sample is cut out from the laminated plate, and a peeling strength test is performed according to JIS-C6471 on an actual sample and a sample after soaking into a molten solder at a temperature of 260° C. for sixty seconds. A result is shown in Table 1. The peeling strength is sufficiently satisfying a bonding strength between the metal core and the insulating substrate required for a metal core substrate for a circuit board (higher than 1 kN/m).

TABLE 2

| | Location of the measurement | | | | | | | |
|---|---|---|---|---|---|---|---|---|
| | Upper side at center | Lower side at center | Upper side at right end | Center at right end | Lower side at right end | Upper side at left end | Center at left end | Lower side at left end |
| | Initial stage (before the solder heat resistant test) (kN/m) | | | | | | | |
| MIN | 3.3 | 3.3 | 3.0 | 3.0 | 3.2 | 2.7 | 3.1 | 3.1 |
| MAX | 3.5 | 3.6 | 3.2 | 3.2 | 3.5 | 2.9 | 3.4 | 3.5 |
| AVG | 3.4 | 3.4 | 3.1 | 3.1 | 3.3 | 2.8 | 3.2 | 3.3 |

TABLE 2-continued

| | Location of the measurement | | | | | | | |
|---|---|---|---|---|---|---|---|---|
| | Upper side at center | Lower side at center | Upper side at right end | Center at right end | Lower side at right end | Upper side at left end | Center at left end | Lower side at left end |
| | After the solder heat resistant test at 260° C. for 60 seconds (kN/m) | | | | | | | |
| MIN | 3.4 | 3.2 | 3.0 | 3.1 | 3.0 | 3.4 | 3.3 | 3.4 |
| MAX | 3.7 | 3.5 | 3.2 | 3.4 | 3.2 | 3.7 | 3.7 | 3.6 |
| AVG | 3.5 | 3.3 | 3.1 | 3.3 | 3.1 | 3.6 | 3.5 | 3.4 |

Example 3

First of all, there is designed to be performed an anodic treatment for each of the copper plates that individually have the thickness of 400 μm and 200 μm respectively, with a solution temperature as 32° C., and with an electric current density of 2 A/dm² for approximately five minutes for each thereof. And then thereafter there is designed to be performed a cathodic treatment for each thereof, with the solution temperature as similar thereto, with an electric current density of similar thereto, and with an amount of time as similar thereto as well. Moreover, there is defined the processes as one cycle thereof, and then thereby there is designed to be performed the processes as two cycles thereof. Hence, there becomes to be produced a copper plate with a roughened surface. Further, there is shown a state of the surface of the copper plate with the roughened surface in FIG. 6 (with a multiplying factor of 3000 times according to the SEM). Still further, according to the figure, it becomes clear that the grain size of the protrusion with the fine bump shape on the primary surface thereof is not larger than 3 μm, and that there becomes to be covered substantially all over the surface thereof uniformly with the protrusion with the fine bump shape thereon. Still further, there becomes able to be recognized thereby that there is a part thereon to become the bump shape as the cluster shape, however, each of the grain size of the part thereon and the height thereof is not more than 10 μm respectively.

Still further, there is designed to be measured the surface roughness thereof by making use of the microscope of color 3D for super deep shape measurement as the type of VK-9510, that is produced by KEYENCE CORPORATION. And then according thereto, the surface roughness thereof as the Rz becomes to be 15.0 μm.

Still further, there is designed for the copper plate with the roughened surface to be attached a cellophane tape that is on the market and has the width of 10 mm approximately, and then thereafter there is designed the same to be performed a pulling off test. As a result thereof, there is not found any peeling off of the protrusion with the fine bump shape thereon at all, but there becomes to be peeled off only the adhesive agent of the cellophane tape from the interface of the cellophane tape, and then there becomes to be remained the adhesive agent of the cellophane tape on the copper plate with the roughened surface.

Next, there is designed to be laminated a prepreg as similar to that according to Example 1 on a copper plate to be roughened one side of the surfaces thereof with the thickness of 200 μm. And then thereafter there is designed to be performed the process of pressing with heating according to the condition as similar thereto. Hence, there becomes to be obtained a laminated plate that is comprised of the copper plate and the insulating plate. Still further, there is designed to be performed thereafter a peeling strength test regarding the laminated plate as similar to that according to Example 1. As a result thereof, there becomes to be obtained the minimum value for all over the plate as 2.1 kN/m, the maximum value as 3.1 kN/m, and the mean value as 2.5 kN/m. Still further, regarding the peeling strength after performing the process for the solder to be heat resistant, there becomes to be obtained the minimum value for all over the plate as 1.9 kN/m, the maximum value as 2.8 kN/m, and the mean value as 2.4 kN/m. Furthermore, there becomes to be obtained the peeling strength, with sufficiently satisfying the strength of adhesive bonding for between the metal core and the insulating substrate, that is required for the metal core substrate for the circuit board (as not weaker than 1 kN/m).

Example 4

First of all, there is designed to be performed an anodic treatment for each of the copper plates that individually have the thickness of 400 μm and 200 μm respectively, with a solution temperature as 22° C., and with an electric current density of 2 A/dm² for approximately five minutes for each thereof. And then thereafter there is designed to be performed a cathodic treatment for each thereof, with the solution temperature as similar thereto, with an electric current density of similar thereto, and with an amount of time as similar thereto as well. Moreover, there is defined the processes as one cycle thereof, and then thereby there is designed to be performed the processes as two cycles thereof. Hence, there becomes to be produced a copper plate with a roughened surface. Further, there is shown a state of the surface of the copper plate with the roughened surface in FIG. 7 (with a multiplying factor of 3000 times according to the SEM). Still further, according to the figure, it becomes clear that the grain size of the protrusion with the fine bump shape on the primary surface thereof is not larger than 5 μm, and that there becomes to be covered substantially all over the surface thereof uniformly with the protrusion with the fine bump shape thereon. Still further, there becomes able to be recognized thereby that there is a part thereon to become the bump shape as the cluster shape, however, each of the grain size of the part thereon and the height thereof is not more than 10 μm respectively.

Furthermore, there is designed to be measured the surface roughness thereof by making use of the microscope of color 3D for super deep shape measurement as the type of VK-9510, that is produced by KEYENCE CORPORATION. And then according thereto, the surface roughness thereof as the Rz becomes to be 4.0 μm.

Examples 5 to 7

First of all, there is designed to be formed holes as a plurality thereof individually for the through holes on a copper plate for a core that has a thickness of between 200 μm and 400 μm by making use of a drill, with diameters of between 3 mm and 5 mm respectively. Moreover, it may be available to be formed the holes by punching out with making use of a press machine, because there may become to be required the holes as a significant number thereof that may depend on a specification of a design for a substrate. Thereafter, there is designed to be formed the protrusion with the fine bump shape on the surfaces that includes the inner face of the individual holes by making use of the processes for producing the protrusion according to the present invention. As a result thereof, it becomes able to be obtained a copper plate with a roughened surface, that there becomes to be formed uniformly the protrusion with the fine bump shape not only on the primary surface of the copper plate but also including the protrusion at the inner face of the individual holes as well, comparing to the plate to be formed by making use of the processes for producing the same according to the comparative example that will be described later. Further, there are shown each of the states of the individual surfaces of the copper plates to be roughened the surfaces thereof in FIG. 8 to FIG. 10 respectively, wherein each of (A) shows the primary surface thereof with a multiplying factor of 3000 times according to the SEM respectively, each of (B) shows an inner face of a hole thereon with a multiplying factor of 3000 times according to the SEM respectively, and each of (C) shows an edge part of a hole thereon with a multiplying factor of 125 times according to the SEM respectively.

Still further, according to Example 5, it becomes clear that the grain size of the protrusion with the fine bump shape on the primary surface thereof is not larger than 3 μm, and that there is a part thereon to become the bump shape as the cluster shape, and then that each of the grain size of the part thereon and the height thereof is not more than 10 μm respectively. Still further, it becomes clear that the surface roughness thereof as the Rz becomes to be 8.0 μm. Still further, there becomes to be roughened the inner face of the hole thereon as well, and then it becomes clear that the height of the protrusion with the bump shape at the inner face thereof is not higher than 15 μm respectively.

Still further, according to Example 6, it becomes clear that the grain size of the protrusion with the fine bump shape on the primary surface thereof is not larger than 3 μm, and that there is a part thereon to become the bump shape as the cluster shape, and then that each of the grain size of the part thereon and the height thereof is not more than 10 μm respectively. Still further, it becomes clear that the surface roughness thereof as the Rz becomes to be 7.0 μm. Still further, there becomes to be roughened the inner face of the hole thereon as well, and then it becomes clear that the height of the protrusion with the bump shape at the inner face thereof is not higher than 10 μm respectively.

Still further, according to Example 7, it becomes clear that the grain size of the protrusion with the fine bump shape on the primary surface thereof is not larger than 3 μm, and that there is a part thereon to become the bump shape as the cluster shape, and then that each of the grain size of the part thereon and the height thereof is not more than 10 μm respectively. Still further, it becomes clear that the surface roughness thereof as the Rz becomes to be 11.0 μm. Still further, there becomes to be roughened the inner face of the hole thereon as well, and then it becomes clear that the height of the protrusion with the bump shape at the inner face thereof is not higher than 5 μm respectively.

There is designed to be laminated glass epoxy prepreg (a substance for an insulating substrate) as a plurality of sheets onto the copper plate with the roughened surface with the holes that is obtained according to the processes, and then thereafter there is designed to be integrated the sheets thereof by pressing with heating. Still further, there is designed to be removed a portion of the substance for the insulating substrate at each of the locations for the through holes thereon. And then thereafter there is designed to be performed a plating at around the circumference thereof. As a result thereof, it becomes able to obtain a circuit board that there becomes to be formed the through holes with a diameter of approximately 1 mm, respectively.

As a result of performing a test with applying a high voltage (1000 V) to the finished product, it becomes clear that it becomes able to be maintained a nonconductivity as sufficiently for between the individual through holes and the core, and that it becomes able to function a performance thereof as excellently. Furthermore, it becomes clear that there is not found out any peeling off of the resin or any of cracks thereof at all from the core at around each of the through holes even after performing the test for the solder to be heat resistant, and then thereby that the adherence between the core and the resin is excellent as preferred thereto.

Example 8

Here, there is designed to be produced a copper plate with a roughened surface as similar to the processes according to Example 1 to 4, and then there is designed to be formed thereafter a protrusion with a fine bump shape on a primary surface thereof. And then thereafter there is designed to be performed a processing for forming a hole for a through hole on the copper plate. Moreover, there becomes to be obtained a circuit board that is comprised of insulating substrates to be laminated, as similar to the processes according to Example 5.

As a result according to the present example, there is found out at round the circumference of a hole thereon at a period of performing a process of drilling by making use of a drill or a punch, such as a portion to be collapsed that is roughened beforehand thereof, a particle of bump shape to be peeled off, an appearance thereof as not to be uniform, or the like. Further, there becomes to be attached an oil for processing at a period of punching, and then thereby there becomes to be required sometimes further process of additional washing. Furthermore, there becomes not to be roughened at each of the inner faces of the individual holes thereon, and then thereby it becomes to be suspected that there may become to be obtained an adherence for between the resin as weaker at each of the inner faces of the individual holes thereon. However, it becomes able to be obtained an adherence at the primary surface thereof, and then thereby it becomes able to be made use thereof, without finding any problem at all regarding the nonconductivity thereof.

Comparative Example 1

Here, there is designed to be performed an anodic treatment for the above mentioned copper plate, with a solution temperature as 25° C., and with an electric current density of 8.5 A/dm$^2$ for approximately five minutes. And then thereafter there is designed to be performed a cathodic treatment, with a solution temperature as similar thereto, with an electric current density of similar thereto, and with an amount of time as similar thereto as well. Hence, there becomes to be produced a copper plate with a roughened surface. Moreover, in the case thereof, it becomes able to be roughened a center part of the plate as excellently, however, there becomes to be progressed excessively a dissolution at an end part of the plate due to an electrolysis therein because of the electric current density as excessively higher. Further, there becomes to be performed the plating excessively as too much thereon, and then thereby there becomes to be whitened to the utmost. As a result thereof, there becomes to be happened an unevenness for all over the surface of the plate, and then thereby it becomes unable to be made use of the plate for a metal core.

Comparative Example 2

Here, there is designed to be performed an anodic treatment for the above mentioned copper plate, with a solution temperature as 25° C., and with an electric current density of 0.9 A/dm$^2$ for approximately ten minutes. And then thereafter there is designed to be performed a cathodic treatment, with a solution temperature as similar thereto, with an electric current density of similar thereto, and with an amount of time as similar thereto as well. Hence, there becomes to be produced a copper plate with a roughened surface. Moreover, there is shown a state of the surface of the copper plate with the roughened surface in FIG. 11 (with a multiplying factor of 3000 times according to the SEM). Further, in the case thereof, it is found out that there is not progressed to be roughened thereby for all over the surface thereof, and then that it is not able to be formed sufficiently the protrusion with the fine bump shape thereon. Furthermore, the surface roughness as the Rz on the primary surface thereof becomes to be 2.5 µm.

Comparative Example 3

Here, there is designed to be performed an anodic treatment for the above mentioned copper plate, with a solution temperature as 25° C., and with an electric current density of 4.5 A/dm$^2$ for approximately eleven minutes. And then thereafter there is designed to be performed a cathodic treatment, with a solution temperature as similar thereto, with an electric current density of similar thereto, and with an amount of time as similar thereto as well. Hence, there becomes to be produced a copper plate with a roughened surface. Moreover, in the case thereof, it becomes able to be roughened a center part of the plate as excellently, however, there becomes to be progressed excessively a dissolution at an end part of the plate and at a hole for a through hole due to an electrolysis therein. Further, there becomes to be performed the plating excessively as too much thereon, and then thereby there becomes to be whitened to the utmost. As a result thereof, there becomes to be happened an unevenness for all over the surface of the plate, and then thereby it becomes unable to be made use of the plate for a metal core.

Comparative Example 4

Here, there is designed to be performed an anodic treatment for the above mentioned copper plate, with a solution temperature as 25° C., and with an electric current density of 4.5 A/dm$^2$ for approximately two and half minutes. And then thereafter there is designed to be performed a cathodic treatment, with a solution temperature as similar thereto, with an electric current density of 2 A/dm$^2$, and with an amount of time as similar thereto as well. Hence, there becomes to be produced a copper plate with a roughened surface. Moreover, there is shown a state of the surface of the copper plate with the roughened surface in FIG. 12 (with a multiplying factor of 3000 times according to the SEM). Further, in the case thereof, it is found out that there is not progressed to be roughened thereby for all over the surface thereof, and then that it is not able to be formed sufficiently the protrusion with the fine bump shape thereon. Furthermore, the surface roughness as the Rz on the primary surface thereof becomes to be 2.0 µm.

Comparative Example 5

Here, there is designed to be performed an anodic treatment for the above mentioned copper plate, with a solution temperature as 35° C., and with an electric current density of 4.5 A/dm$^2$ for approximately five minutes. And then thereafter there is designed to be performed a cathodic treatment, with a solution temperature as similar thereto, with an electric current density of 1.4 A/dm$^2$, and with an amount of time as similar thereto as well. Hence, there becomes to be produced a copper plate with a roughened surface. Moreover, in the case thereof, there becomes to be occurred a burning of black color on the surface of the copper plate due to cuprous oxide. Further, there is designed for the copper plate with the roughened surface to be attached a cellophane tape that is on the market and has the width of 10 mm approximately, and then thereafter there is designed the same to be performed a pulling off test.

As a result thereof, there becomes to be peeled off the part of the black color. And then thereby it becomes unable to be made use of the plate for a metal core.

Comparative Example 6

Here, there is designed to be performed an anodic treatment for the above mentioned copper plate, with a solution temperature as 17° C., and with an electric current density of 4.5 A/dm$^2$ for approximately ten minutes. And then thereafter there is designed to be performed a cathodic treatment, with a solution temperature as similar thereto, with an electric current density of similar thereto, and with an amount of time as similar thereto as well. Hence, there becomes to be produced a copper plate with a roughened surface. Moreover, there is shown a state of the surface of the copper plate with the roughened surface in FIG. 13 (with a multiplying factor of 3000 times according to the SEM). In such a case, it is found out that there is not progressed to be roughened thereby for all over the surface thereof, and then that it is not able to be formed any of the protrusions as the fine bump shape thereon at all. Accordingly, it becomes unable to be made use of the plate for a metal core. Further, the surface roughness as the Rz on the primary surface thereof becomes to be 1.8 µm.

Comparative Example 7

First of all, there is designed to be formed holes as a plurality thereof individually for the through holes on a copper plate for a core that has a thickness of between 200 µm and 400 µm by making use of a drill, with a diameter between 3 mm and 5 mm respectively. And then thereafter, there is designed to be formed the protrusion with the bump shape with a diameter as several µm on the surfaces that includes the inner face of the individual holes, by making use of the processes for producing the protrusion according to the process of the conventional electroplating thereof. Moreover, there is shown a state of the surface of the copper plate in FIG. 14, wherein (A) shows the primary surface thereof with a multiplying factor of 3000 times according to the SEM, (B) shows an inner face of a hole thereon with a multiplying factor of 500 times according to the SEM, and (C) shows an inner face of a hole thereon with a multiplying factor of 125 times according to the SEM. Further, it is found out that the grain size of the protrusion with the fine bump shape on the primary surface thereof is not larger than 5 μm, and that there is a part thereon to become the bump shape as the cluster shape, and then that each of the grain size of the part thereon and the height thereof is not more than 10 μm respectively. Still further, it is found out that the surface roughness thereof as the Rz becomes to be 10.0 μm.

However, according to the copper plate, there becomes to be as not smaller than 20 μm for a size of the protrusion with the bump shape at the inner face, that is a difference between a concave thereon and a convex thereon, comparing to that according to the primary surface thereof. Still further, even in the case of performing an adjustment of the condition for the electroplating thereof, it becomes unable to form any of the protrusion with the bump shape as uniformly thereon with including the two of the faces.

There is designed to be made use of the electric current density as a larger amount according to the process of the conventional electroplating thereof, and then thereby that there becomes to be convergent the electric current as the larger amount from the electrode to each of the inner faces of the individual holes thereon, that have the surfaces with an area in total as smaller, at the places that each of the holes passes comparing to other places on the surfaces of the copper plate that is designed to be faced to the electrode.

Still further, there is designed to be adhered thereafter a substrate of resin thereon, and then there becomes to be produced a circuit board, as similar to that according to Example 5. Still further, there is designed to be performed a test with applying a high voltage (1000 V) to the board. And then as a result thereof, it is found out that there is a case where it is not able to be maintained nonconductivity for between the individual through holes and the core.

Furthermore, according to an analysis, it is found out that in addition to the problem on the adherence of therebetween, there becomes to be peeled off the protrusion of the copper fine particles due to the pressure of pressing, and then there becomes to be penetrated the protrusion into the inside of the resin, at the period of the process of laminating the insulating substrate of resin, and then thereby that it becomes to be worsened the nonconductivity of therebetween, because there is not designed to be sufficiently enough for the distance for insulation of between the individual holes and the core. That is to say, it becomes clear that there becomes to be happened the problems as mentioned above in the case of producing the copper plate with the roughened surface that the holes are opened thereon, by making use of the process of the conventional electroplating thereof.

Thus, according to the above description, it becomes clear that regarding the copper plate for the metal core that has any of the holes individually for the through holes in particular, it becomes able to form the protrusion with the fine bump shape on the surface of the copper plate, by making use of the processes according to the present invention, after forming any of the holes on the copper plate, and then thereby that it becomes able to perform the process of roughening as uniformly for the surface thereof and for the inner face of any of the holes thereon, therefore that it is the optimum.

DESCRIPTION OF THE REFERENCE SYMBOLS

Figure 1:
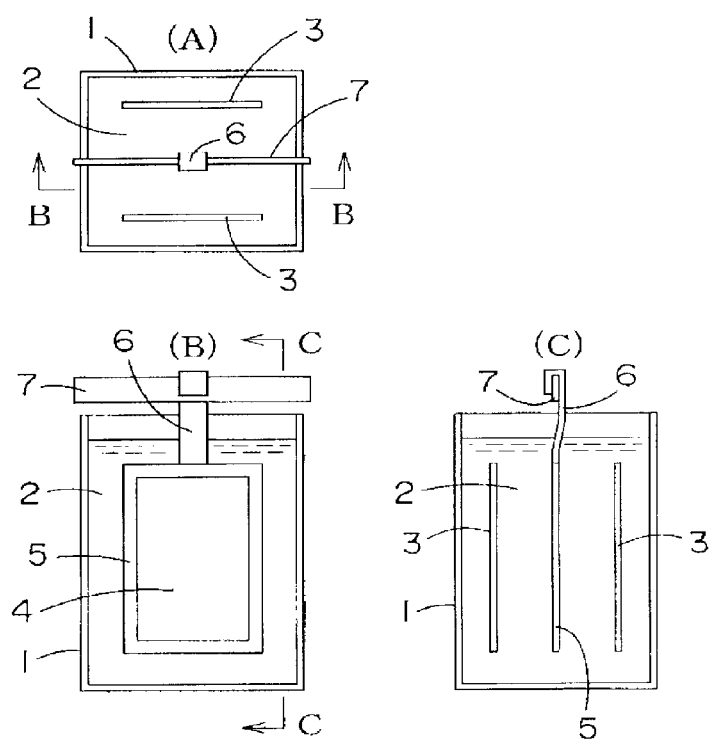
FIG. 1 is a view showing one embodiment according to the present invention, wherein (A) is a plan view, (B) is a cross sectional view from a view point of B-B line in (A), and (C) is a cross sectional view from a view point of C-C line in (B).
Figure 2:
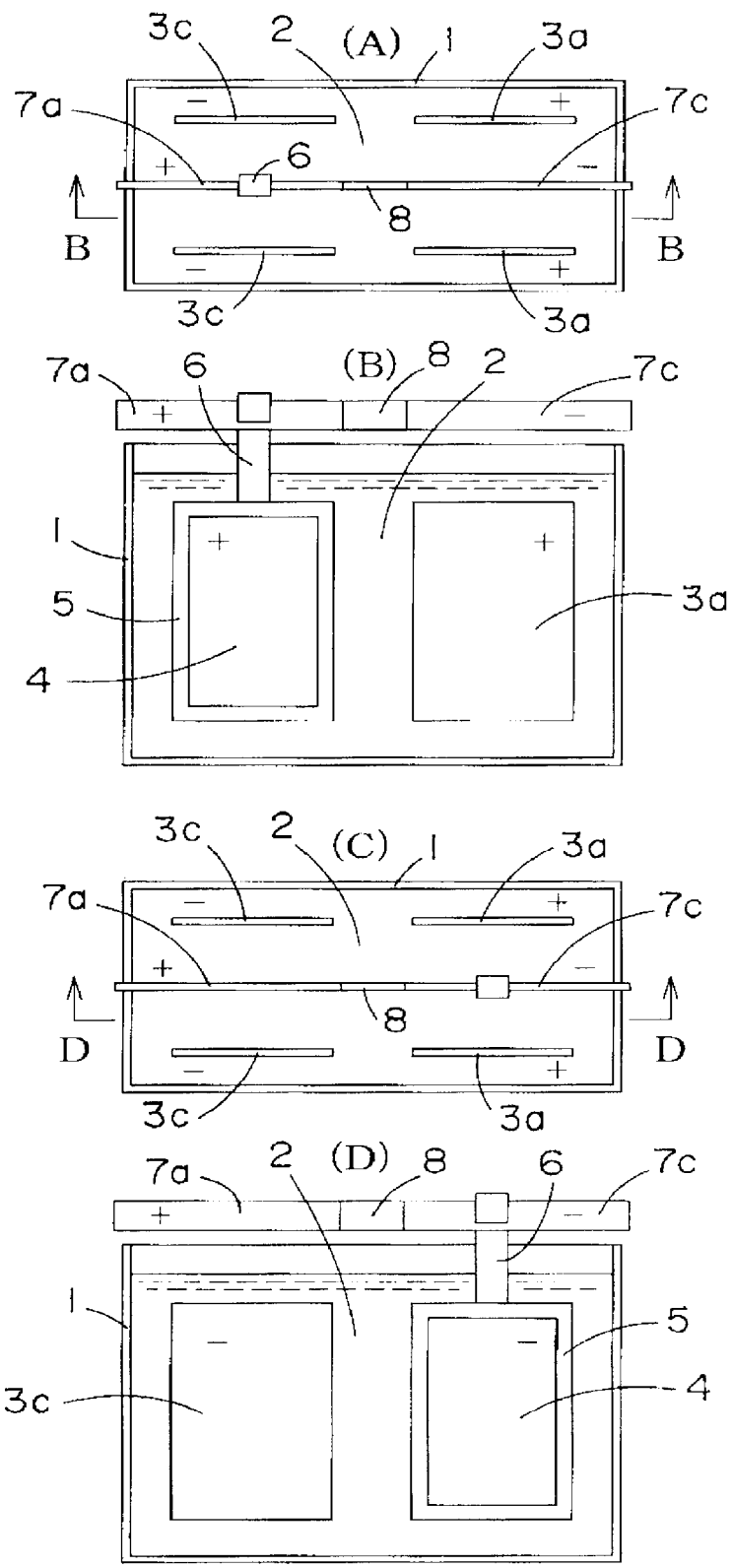
FIG. 2 is a view showing one embodiment as another one according to the present invention, wherein (A) is a plan view, (B) is a cross sectional view from a view point of B-B line in (A).
Figure 3:
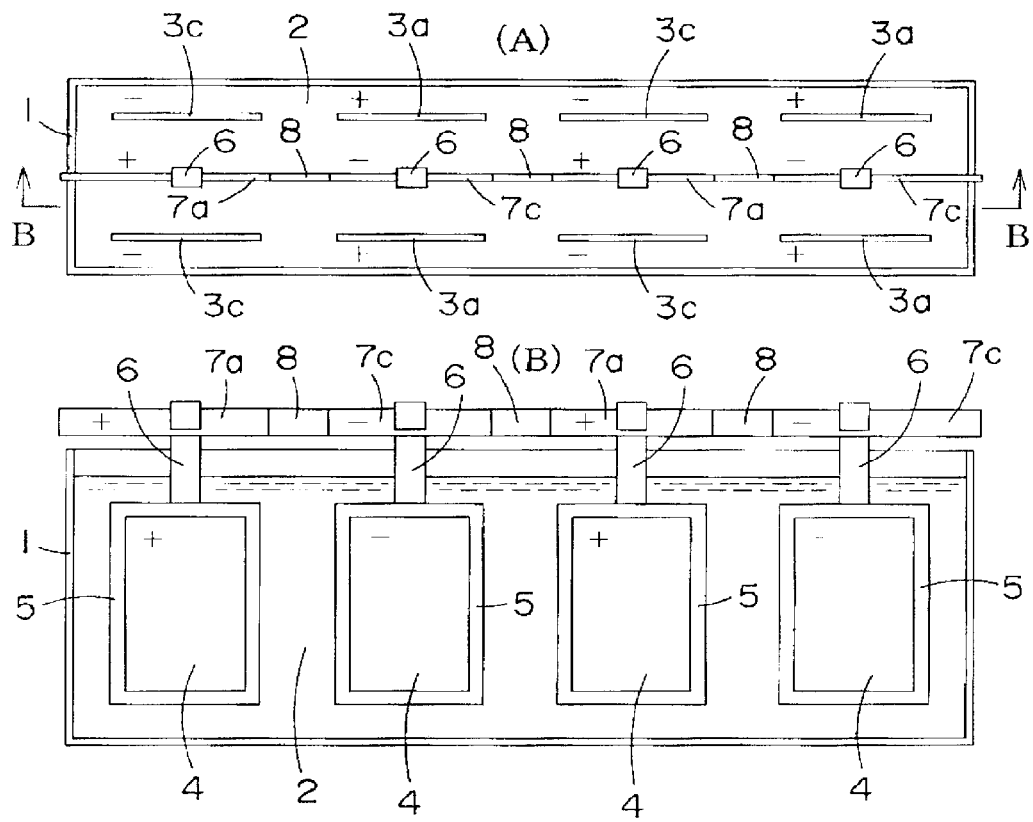
FIG. 3 is a view showing one embodiment as further another one according to the present invention, wherein (A) is a plan view, (B) is a cross sectional view from a view point of B-B line in (A).
Figure 4:
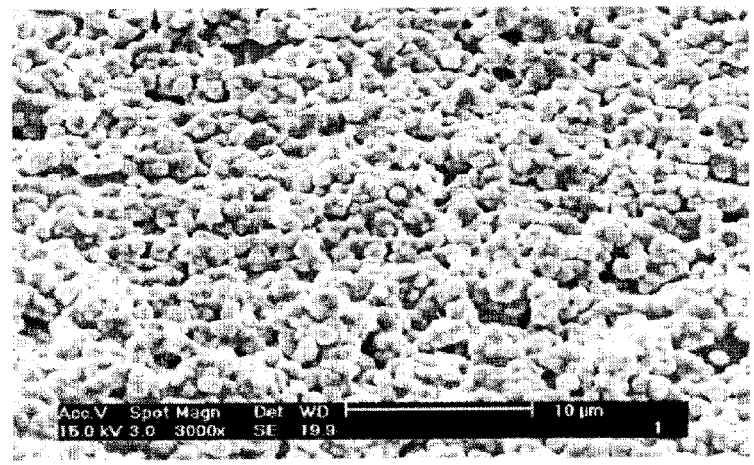
FIG. 4 is a photo according to a scanning electron microscope showing a state of a surface on a copper plate with a roughened surface according to Example 1.
Figure 5:
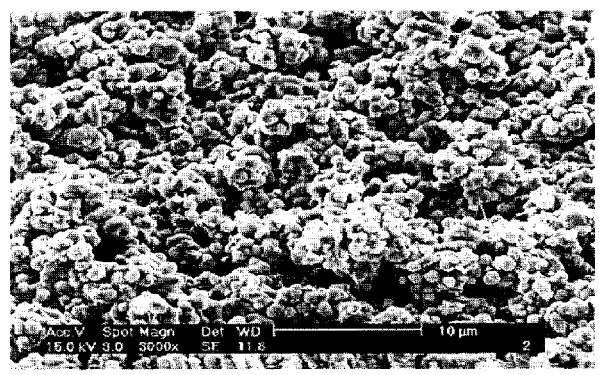
FIG. 5 is a photo according to a scanning electron microscope showing a state of a surface on a copper plate with a roughened surface according to Example 2.
Figure 6:
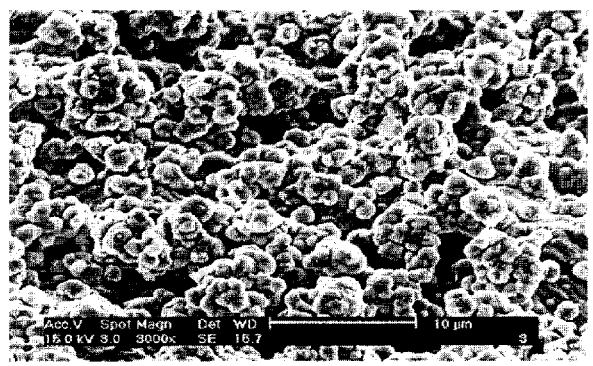
FIG. 6 is a photo according to a scanning electron microscope showing a state of a surface on a copper plate with a roughened surface according to Example 3.
Figure 7:
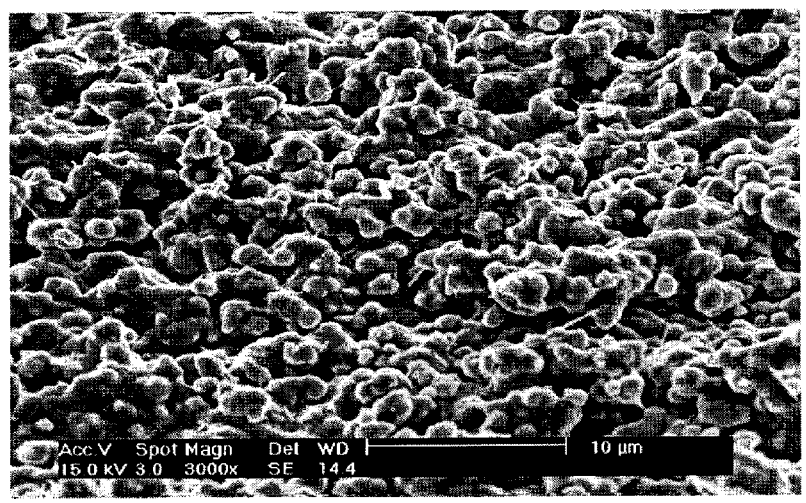
FIG. 7 is a photo according to a scanning electron microscope showing a state of a surface on a copper plate with a roughened surface according to Example 4.
Figure 8A:
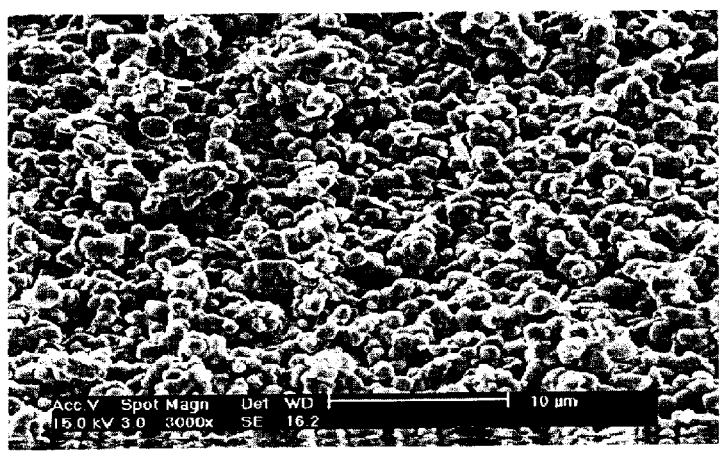
FIG. 8A is a photo according to a scanning electron microscope showing a state of a surface on a copper plate with a roughened surface according to Example 5, wherein there is shown a primary surface thereof.
Figure 8B:
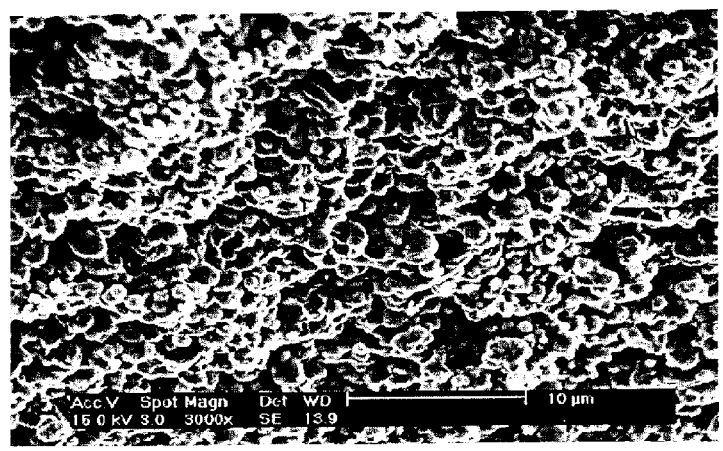
FIG. 8B is a photo according to a scanning electron microscope showing a state of a surface on a copper plate with a roughened surface according to Example 5, wherein there is shown an inner face of a hole thereon.
Figure 8C:
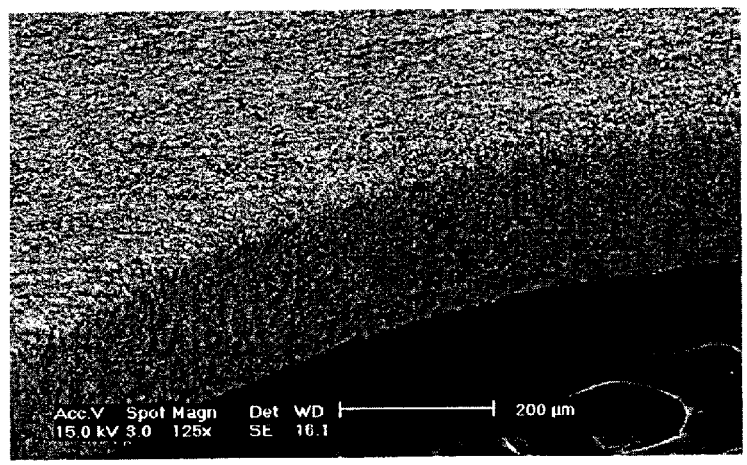
FIG. 8C is a photo according to a scanning electron microscope showing a state of a surface on a copper plate with a roughened surface according to Example 5, wherein there is shown an edge part of a hole thereon.
Figure 9A:
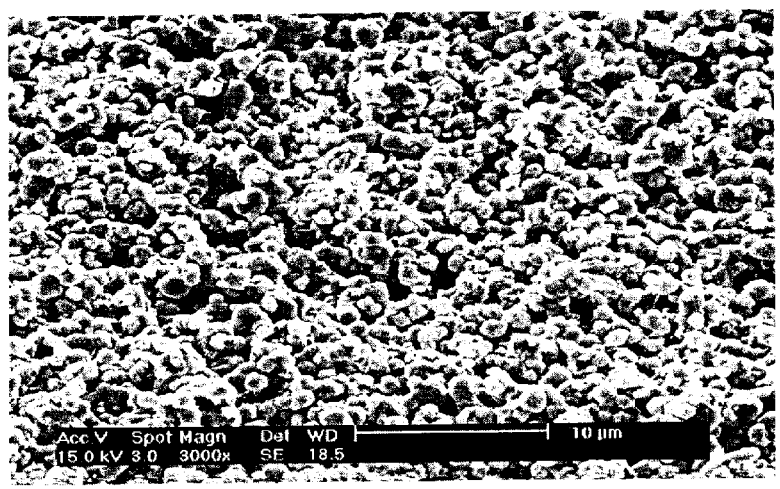
FIG. 9A is a photo according to a scanning electron microscope showing a state of a surface on a copper plate with a roughened surface according to Example 6, wherein there is shown a primary surface thereof.
Figure 9B:
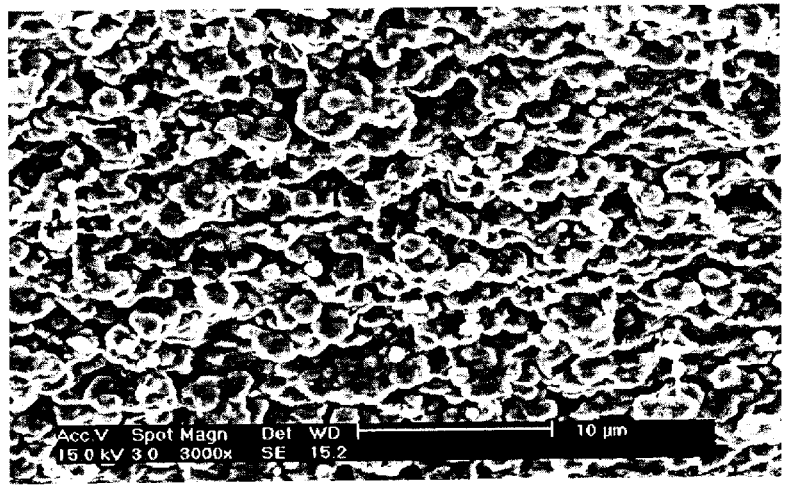
FIG. 9B is a photo according to a scanning electron microscope showing a state of a surface on a copper plate with a roughened surface according to Example 6, wherein there is shown an inner face of a hole thereon.
Figure 9C:
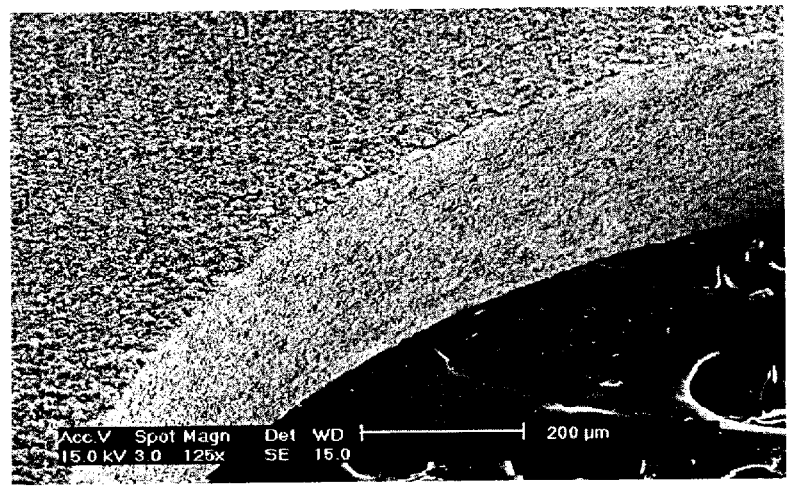
FIG. 9C is a photo according to a scanning electron microscope showing a state of a surface on a copper plate with a roughened surface according to Example 6, wherein there is shown an edge part of a hole thereon.
Figure 10A:
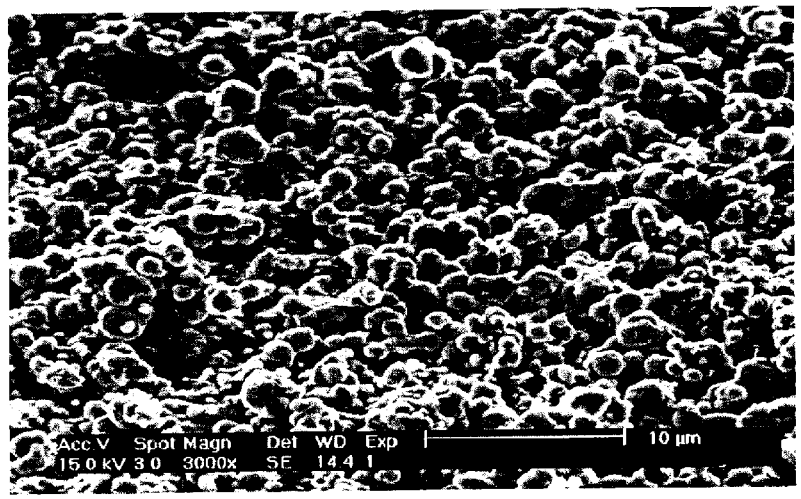
FIG. 10A is a photo according to a scanning electron microscope showing a state of a surface on a copper plate with a roughened surface according to Example 7, wherein there is shown a primary surface thereof.
Figure 10B:
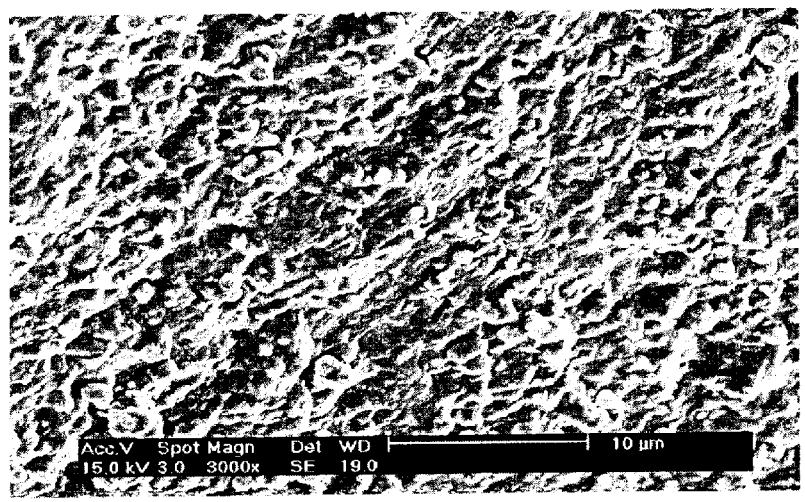
FIG. 10B is a photo according to a scanning electron microscope showing a state of a surface on a copper plate with a roughened surface according to Example 7, wherein there is shown an inner face of a hole thereon.
Figure 10C:
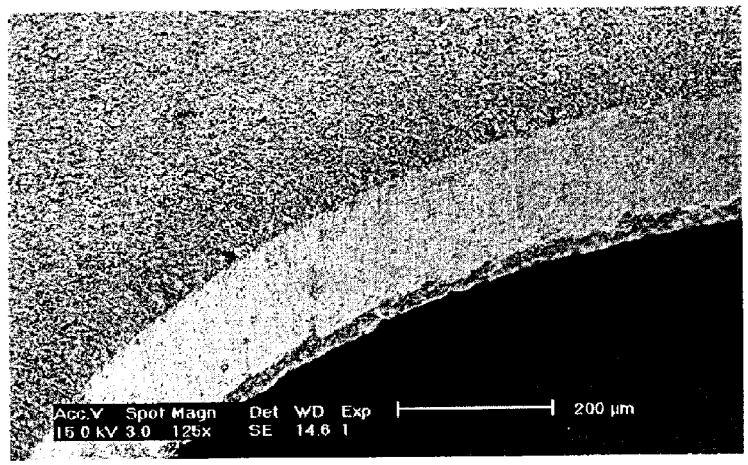
FIG. 10C is a photo according to a scanning electron microscope showing a state of a surface on a copper plate with a roughened surface according to Example 7, wherein there is shown an edge part of a hole thereon.
Figure 11:
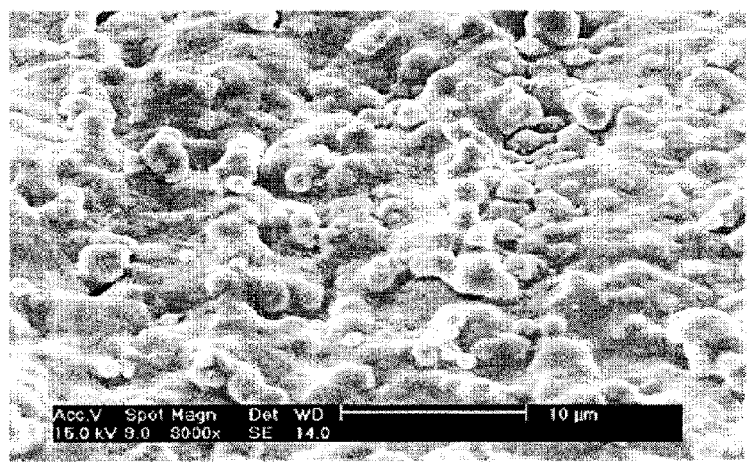
FIG. 11 is a photo according to a scanning electron microscope showing a state of a surface on a copper plate with a roughened surface according to Comparative example 2.
Figure 12:
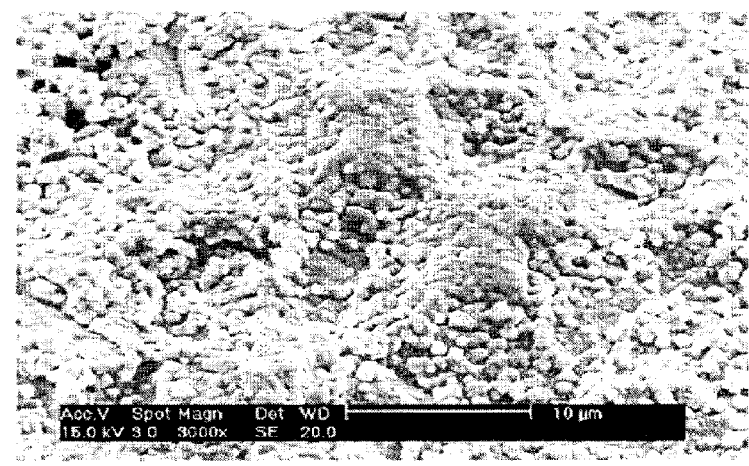
FIG. 12 is a photo according to a scanning electron microscope showing a state of a surface on a copper plate with a roughened surface according to Comparative example 4.
Figure 13:
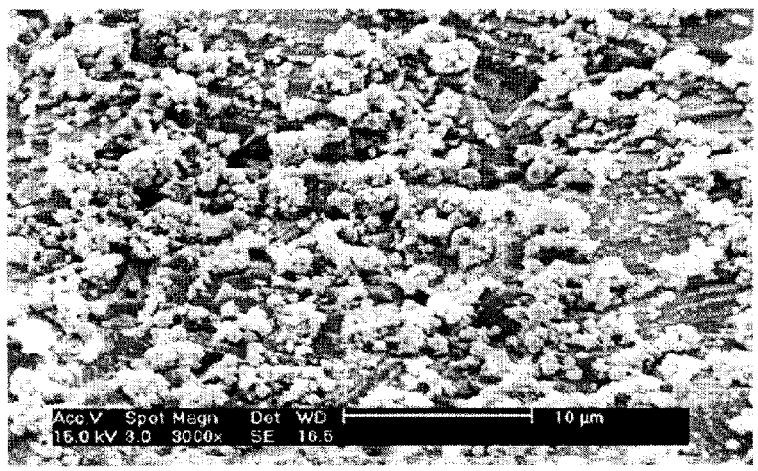
FIG. 13 is a photo according to a scanning electron microscope showing a state of a surface on a copper plate with a roughened surface according to Comparative example 6.
Figure 14A:
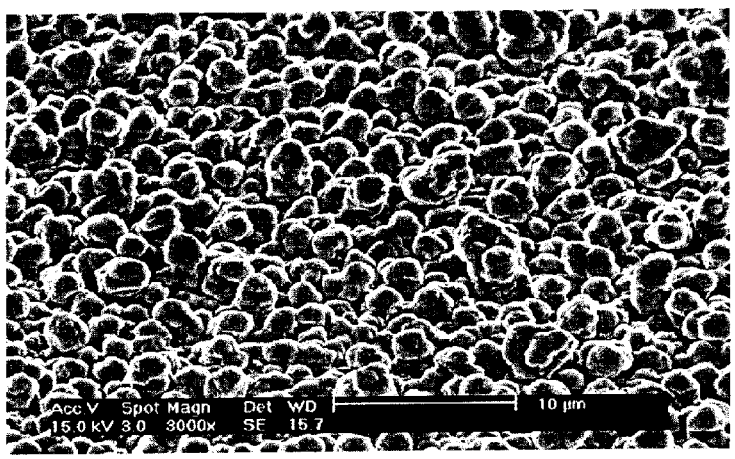
FIG. 14A is a photo according to a scanning electron microscope showing a state of a surface on a copper plate with a roughened surface according to Comparative example 7, wherein there is shown a primary surface thereof.
Figure 14B:
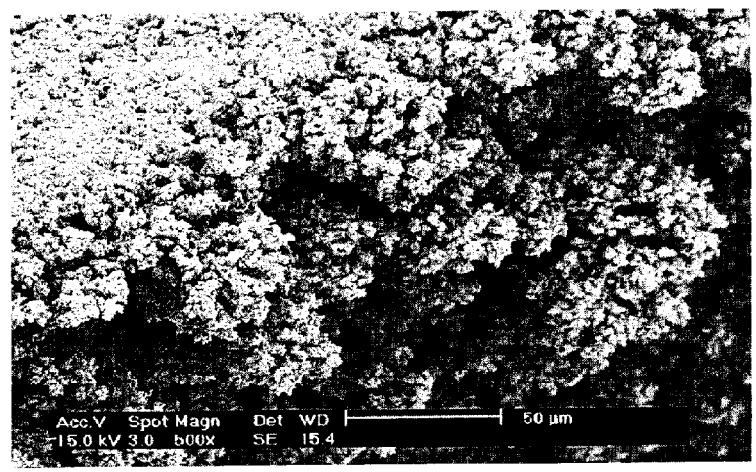
FIG. 14B is a photo according to a scanning electron microscope showing a state of a surface on a copper plate with a roughened surface according to Comparative example 7, wherein there is shown an inner face of a hole thereon.
Figure 14C:
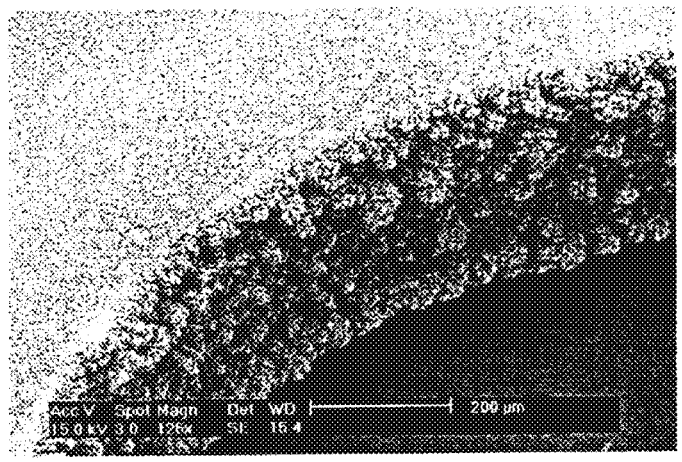
FIG. 14C is a photo according to a scanning electron microscope showing a state of a surface on a copper plate with a roughened surface according to Comparative example 7, wherein there is shown an edge part of a hole thereon.
Figure 15:
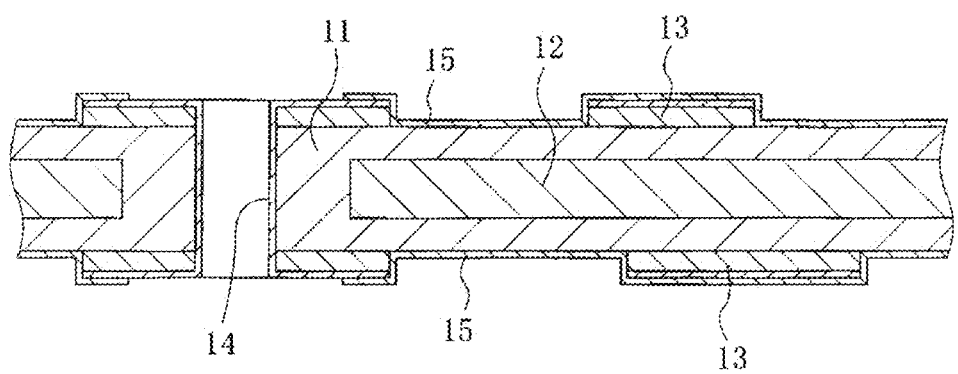
FIG. 15 is a cross sectional view showing one example of a metal core substrate for a circuit board.
Figure 16:
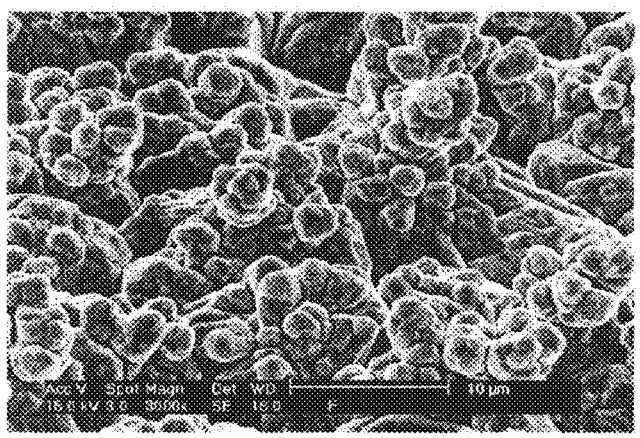
FIG. 16 is a photo according to a scanning electron microscope showing a state of a surface on an electrolytic copper foil for a common printed circuit board.

1 ELECTROLYTIC BATH
2 ELECTROPLATING SOLUTION FOR PLATING COPPER
3 ELECTRODE
3a POSITIVE ELECTRODE
3c NEGATIVE ELECTRODE
4 COPPER PLATE WITH A ROUGHENED SURFACE
5 FRAME BODY
6 HANGER METAL FITTING
7 BUS BAR
7a BUS BAR FOR A POSITIVE ELECTRODE
7c BUS BAR FOR A NEGATIVE ELECTRODE
8 INSULATING BAR

What is claimed is:

1. A rolled copper plate with a roughened surface having a predetermined hole formed at a predetermined position thereof, a thickness of the rolled copper plate being between 100 µm and 500 µm, a surface of the rolled copper plate having a grain size between 0.5 µm and 3.0 µm and a surface roughness Rz between 7 µm and 16 µm,
   wherein said predetermined hole includes a roughened inner surface having a protrusion with a fine bump shape thereon, and
   said protrusion with the fine bump shape has a height not higher than 20 µm.

2. The rolled copper plate according to claim 1, said roller copper plate being produced through the steps of:
   arranging electrodes with a same polarity to face each other in an electroplating copper solution;
   arranging the rolled copper plate between the electrodes;
   performing an anodic treatment to form a copper fine particle on both surfaces of the rolled copper plate through an electrolytic process with the copper plate as a positive electrode and the electrodes as a negative electrode; and
   performing a cathodic treatment to fix the copper fine particle to the surfaces of the rolled copper plate to form the roughened surface through a copper electroplating with the copper plate as a negative electrode and the electrodes as a positive electrode.

* * * * *